United States Patent
Iacoponi et al.

(10) Patent No.: US 6,244,210 B1
(45) Date of Patent: Jun. 12, 2001

(54) STRENGTH COIL FOR IONIZED COPPER PLASMA DEPOSITION

(75) Inventors: John A. Iacoponi; Paul R. Besser, both of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/430,452

(22) Filed: Oct. 29, 1999

(51) Int. Cl.$^7$ ..................................... C23C 16/00
(52) U.S. Cl. ................. 118/723 I; 204/298.06; 343/700 R
(58) Field of Search ............ 118/723 I, 723 IR, 118/723 AN; 156/345; 204/298.06, 298.34; 315/111.51; 343/700 R, 731, 732, 741

(56) References Cited

U.S. PATENT DOCUMENTS

| | | | |
|---|---|---|---|
| 5,491,483 | * 2/1996 | D'Hont | 342/62 |
| 5,571,366 | * 11/1996 | Ishii et al. | 156/345 |
| 5,935,373 | * 9/1999 | Koshimizu | 156/345 |
| 6,005,524 | * 12/1999 | Hayes et al. | 343/702 |
| 6,136,139 | * 10/2000 | Ishii et al. | 156/345 |

* cited by examiner

*Primary Examiner*—Gregory Mills
*Assistant Examiner*—Luz Alejandro
(74) *Attorney, Agent, or Firm*—Lariviere, Grubman & Payne, LLP

(57) ABSTRACT

A new type of plasma coil for use in ionized metal plasma deposition systems. This new coil provides significant added strength to prevent sagging or other mechanical deformation. The improved coil consists of a core of a high strength material such as Titanium, for example. The rigid core is surrounded on all sides by a layer of pure copper. The rigid core could be made of other refractory metals. A Titanium copper alloy core could be used and would bind the Titanium to the copper within the core to prevent it from diffusing or reacting with the pure copper outer layer.

16 Claims, 3 Drawing Sheets

STRENGTH COIL FOR IONIZED COPPER PLASMA DEPOSITION

BACKGROUND OF THE INVENTION

The present invention relates to a coil for a sputter deposition machine for processing semiconductor substrates and, more particularly, to an improved coil for an ionized metal plasma physical vapor deposition machine.

Typically, an IMP PVD (ionized metal plasma physical vapor deposition) machine is provided with an RF (radio frequency) coil in the chamber thereof for the purpose of emitting RF energy within the area of the coil. The purpose of the RF energy is to ionize copper atoms as they are emitted from a copper source target during deposition. The ionized copper atoms are then accelerated towards the surface of the silicon wafer.

Typically, the plasma coils are made of pure copper. Pure copper is a relatively soft material so that when high power above about two kilowatts is applied to a plasma coil in a conventional IMP Cu PVD system, the Cu coil heats up and is susceptible to sagging or other mechanical deformation. The sagging or other deformation can lead to problems ranging from non-uniformities in the deposition, to reduced chamber part life to, more severely, shorting of the coil with other chamber parts. Coil failure can take several forms. Even slight mechanical deformation by sagging, twisting, buckling or other means can cause the deposition process, specifically the uniformity of the layer deposited on the silicon wafer, to drift out of specification. In a production environment, maintaining process parameters such as film uniformity is critical.

Greater mechanical deformation of the coil caused by overheating could cause the coil to short with the chamber shields, which are the closest chamber part.

Accordingly, there is a need for an improved strength coil for use in IMP copper deposition.

BRIEF SUMMARY OF THE INVENTION

In accordance with the principles of the present invention, there is provided a strengthened coil for use in an ion metal plasma physical vapor deposition chamber. The improved coil is made of a metallic strip approximately 30"×1.5"× 0.25". In the embodiment described herein, the metallic strip is formed into a one-turn loop, but it should be understood that a multi-turn loop may be used, if desired. The metallic strip comprises a rigid core surrounded by an outer layer made of pure copper. The rigid core is made, at least in part, of a material selected from one of the following refractory metals: Titanium, Tantalum or Tungsten. The rigid core is bonded to the outer layer of copper by a diffusion bonding process in which the rigid core and the outer layer are pressed together at high pressure and ultrasonic energy is applied thereto.

BRIEF DESCRIPTION OF THE DRAWINGS

The invention, including its various objects, features, and advantages, may be more readily understood with reference to the following detailed description of the best mode for carrying out the invention, taken in conjunction with the accompanying drawings, wherein like reference numerals designate like structural elements, and in which.

DETAILED DESCRIPTION OF THE BEST MODE FOR CARRYING OUT THE INVENTION

Deposition processes and deposition equipment used in the fabrication of semiconductor devices are well known in the art. Accordingly, in order to avoid confusion while enabling those skilled in the art to practice the claimed invention, this specification omits many details with respect to deposition processes and deposition equipment.

The subject matter of the present invention is an improved component for an Ion Metal Plasma (IMP) deposition system. In order to better explain the manner and process of making and using the present invention, there follows a brief explanation of the system in which the improved component of the present invention is used.

Figure 1:
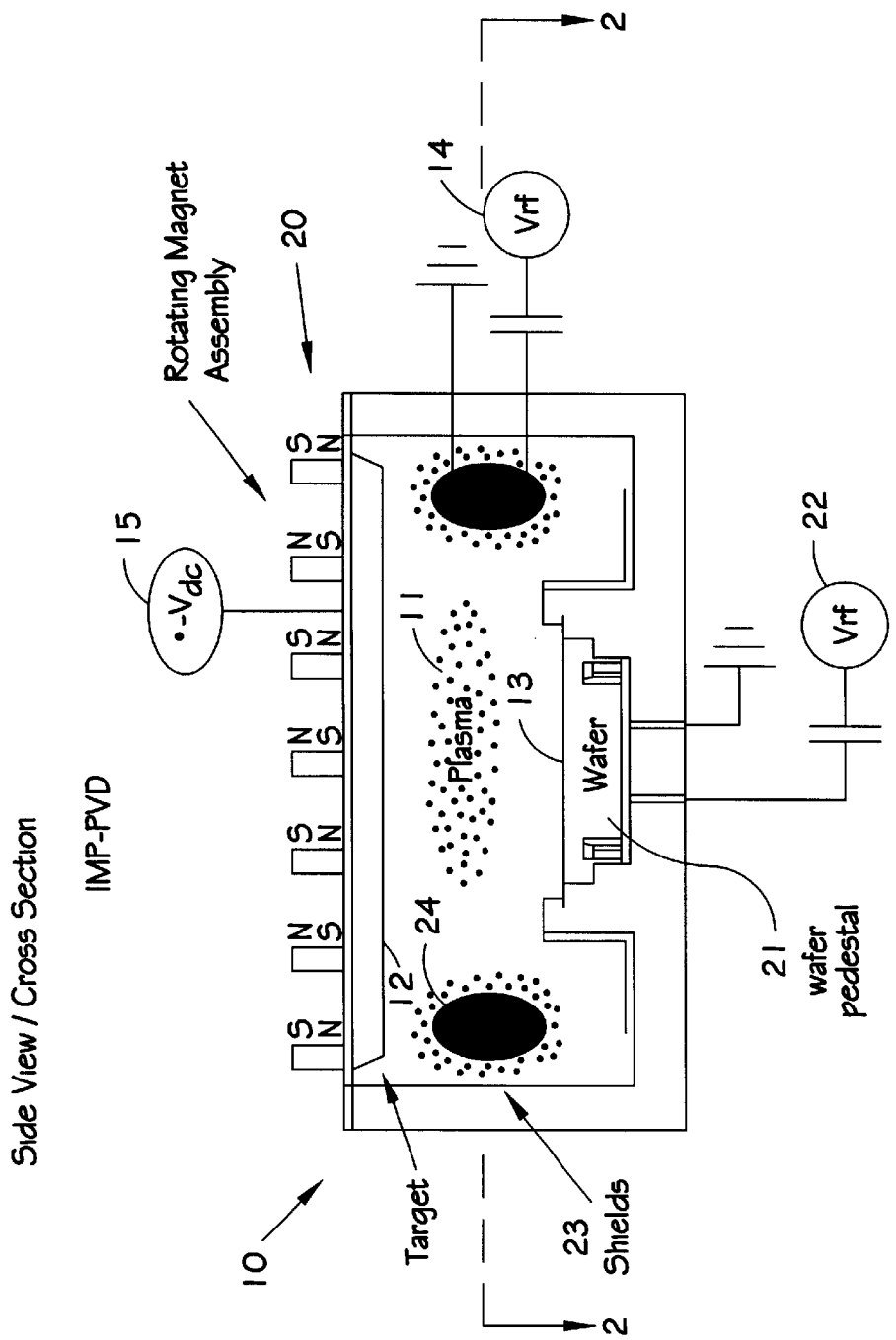
FIG. 1 is a side view in cross-section of a sputter deposition chamber for use in manufacturing semiconductor devices.

FIG. 1 is a schematic diagram illustrating symbolically the basic features of a chamber 10 which may be used in the fabrication of semiconductor products such as integrated circuits, or the like. More particularly, FIG. 1 is a side view in cross section of a chamber 10 suitable for use with IMP Physical Vapor Deposition (PVD) technology processes. IMP technology is an extension of conventional PVD technology. Deposition chambers such as the chamber 10 are manufactured by firms such as Applied Materials Corp. of Santa Clara, Calif., Novellus Systems of San Jose, Calif., and Tokyo Electron Limited of Tokyo, Japan, for example.

Inside the chamber 10, a plasma 11 is generated between a target 12 and a wafer substrate 13. The target 12 is metallic, and the wafer substrate 13 is silicon. The wafer substrate 13 is mounted to a wafer pedestal 21. This arrangement acts as a parallel plate configuration, with the metallic target 12 acting as one electrode, and the wafer pedestal 21 upon which the silicon wafer substrate 13 is seated acting as a second electrode. The density of the plasma 11 may be from 10 to the 11th power per cubic centimeter to 10 to the 12th power per cubic centimeter, which is generally considered to be a medium density. Sputtered metal is ionized by passing it through the plasma 11. A radio frequency (RF) energy source 14 and a direct current (DC) source 15 are connected to the chamber 10. The metal ions are accelerated toward the wafer substrate 13, where they are deposited.

Typically, the chamber 10 is evacuated to a base pressure of below 1E-5 torr, and process gases are introduced. These gases may be inert gases such as Argon, or reactive gases such as N2. A bias is applied between the two electrodes with sufficient energy such that the gas atoms are ionized, directed toward the surface of the metallic target 12, and have sufficient energy to eject metal atoms from the surface of the target 12. The chamber 10 is provided with a rotating magnet assembly 20 disposed above the target 12 and has the DC source 15 connected thereto. A wafer RF bias source 22 is coupled to the wafer pedestal 21.

A shield 23 is provided within the chamber 10 and is disposed around the region between the target 12 and the wafer substrate 13. The shield 23 is typically a rigid part that defines the deposition area, preventing spurious deposition on the entire chamber body, as well as helping to determine the electrical/plasma characteristics of the chamber 10. The shield 23 is typically made of metal and surrounds the immediate area around the wafer substrate 13, the wafer pedestal 21, and the target 12.

A one-turn annular coil 24, that is the subject matter of the present invention, is disposed between the target 12 and the wafer substrate 13. The plasma 11 is formed within the coil 24. The RF energy source 14 is coupled to the coil 24 so that the coil 24 is enabled to emit RF energy within the area of the coil 24. The RF energy ionizes atoms of the material being deposited. Typically, the material being deposited is copper, for example. The atoms of copper are emitted from the target 12 during the deposition process. The ionized atoms of copper are then accelerated toward the surface of the wafer substrate 13. The acceleration provides a high degree of directionality to the copper atoms/ions hitting the surface. The directionality aids the deposition of copper at the bottom of features such as trenches or holes etched into various layers. Without added directionality, the copper atoms would deposit only at the top of an etched feature, not at the bottom where it is needed. The improved coil 24 of the present invention is a key element of the deposition chamber 10 shown in FIG. 1.

Figure 2:
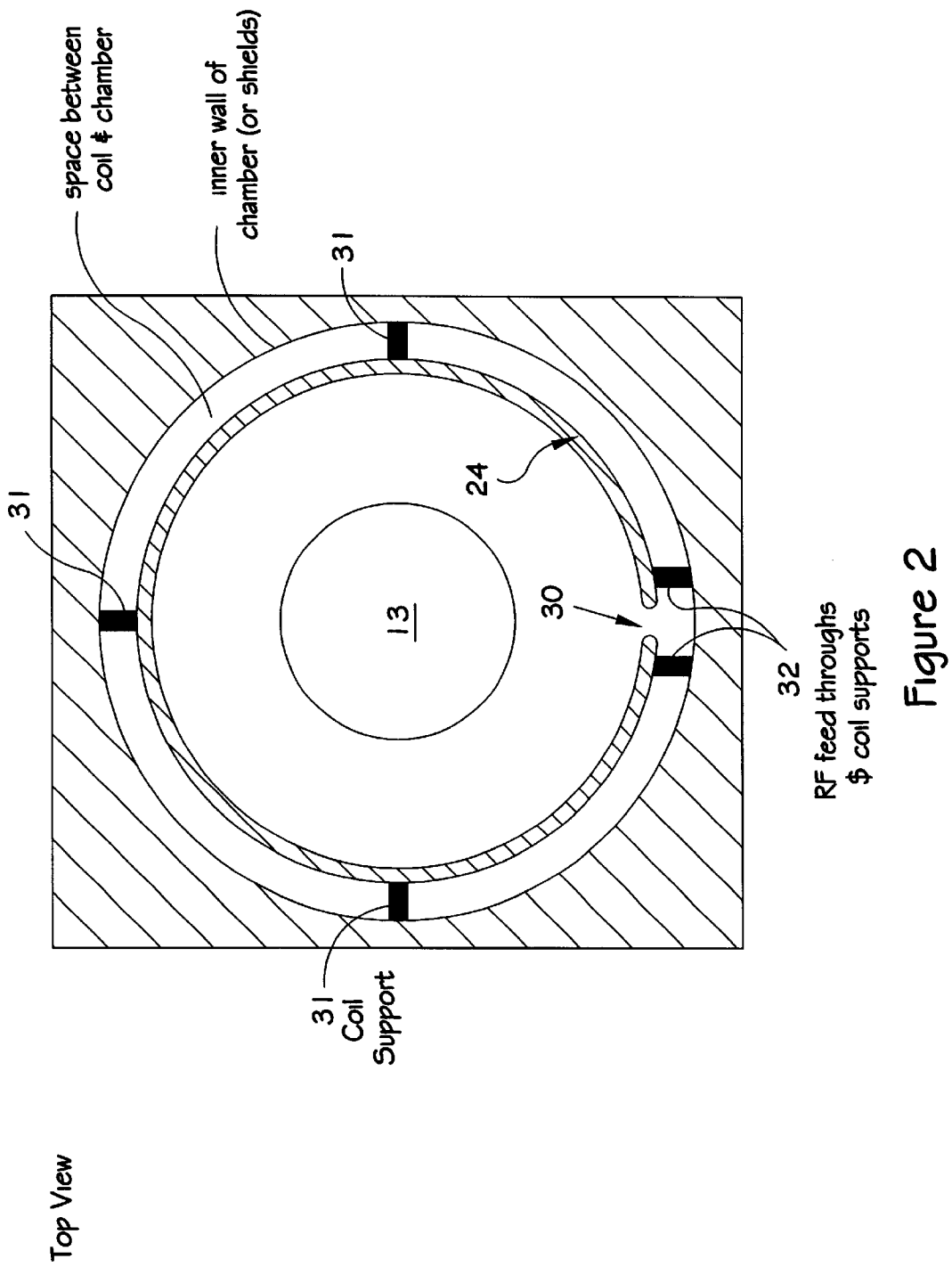
FIG. 2 is a cross-section of the chamber of FIG. 1, taken along the lines 2—2, and showing a plan view of an embodiment of a coil constructed in accordance with the principles of the present invention.
Figure 3:
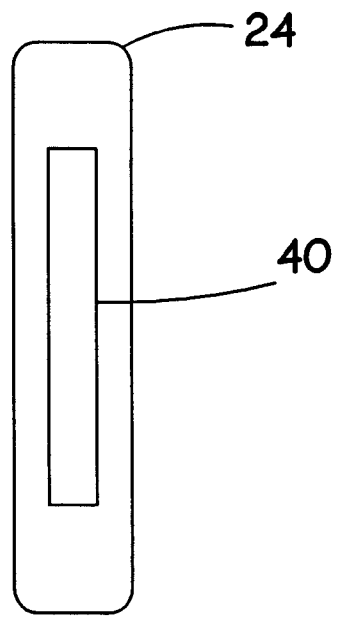
FIG. 3 is a cross-sectional view of a piece of the coil shown in FIG. 2 to illustrate the rigid core surrounded by an outer copper layer.

FIG. 2 is a cross-section of FIG. 1, taken along the lines 2—2 looking down on the wafer substrate 13. The coil 24 is generally annular but is not a continuous circle and has a space 30 between the two ends thereof. Typically, the coil 24 is manufactured as a copper strip about 30"×1.5"×0.25" bent into a one-turn loop. The coil 24 is physically supported and electrically isolated from the chamber body or other metallic chamber parts by a plurality of support members 31. For the sake of convenience, three such support members 31 are shown in FIG. 3, although more than three or less than three may be used if desired. However, arbitrarily changing the number of non-metallic surfaces in the deposition region may deleteriously change the particle or defect levels on the silicon wafer substrate 13.

The support members 31 rigidly attach the coil 24 to chamber shield parts, and are a combination of mechanical support and electrical stand-off. These support members 31 are of a complex design consisting of several overlapping ceramic parts that are strong enough to hold the coil 24, are insulators so that they do not short the coil 24 to other metallic parts, and are of a design such that when they are coated with copper during normal operation of the chamber 10, they do not lose their insulating properties. These support members 31 do not form a part of the present invention.

Two connection members 32, which also serve as supports, are connected to the ends of the coil 24, one on either side of the space 30. These connection members 32 are RF feedthroughs constructed similar to the support members 31. They connect the RF source 14 to the coil 24. The connection members 32 also provide support and isolation for the coil 24. The support members 31 and connection members 32 may be fastened to the coil 24 by any suitable method. Typically, the support members 31 and the connection members 32 screw into threaded holes provided in the outside of the coil 24.

In accordance with the principles of the present invention, the improved coil 24 is made in a way to provide significant added strength to prevent sagging or other mechanical deformation. Referring now to FIG. 3, the coil 24 is provided with a core 40 of high strength material. The core 40 is surrounded on all sides by a layer of pure copper. The high strength core 40 could be made of pure Titanium or some other refractory metal such as Tantalum or Tungsten. The core 40 could also be made of Aluminum or some alloy of Aluminum. The high strength core 40 could also be made of stainless steel or some other iron or nickel based alloy. The high strength core 40 could be an alloy of two or more metals such as Ti—Ta, Ti—W, etc. The high strength core 40 could be an alloy of Titanium and copper, or copper plus other metals. An advantage of the use of Ti—Cu alloy would be to bind the Ti to the copper within the core 40 to prevent it from diffusing or reacting with the pure copper outer layer. The preferred material for the core 40 would be Ti or Ti—Cu alloy.

The preferred method of manufacturing the strengthened coil 24 in accordance with the principles of the present invention, would be to diffusion bond a pure copper outer layer to the strengthening core 40 using a diffusion bonding process, where the two materials are pressed together at high pressure and ultrasonic energy is applied to tightly bond the two materials. Such diffusion bonding processes are well known in the art.

It should be understood that the high strength coil 24 of the present invention is important to IMP deposition processes, particularly when applying RF power above about two kilowatts to the coil 24. Even slight deformation of the coil 24 can cause the uniformity of the deposition layer on the wafer substrate 13 to drift out of specification. In a production environment, maintaining process parameters such as film uniformity is critical.

Thus, there has been described an improved high strength coil for ionized metal plasma copper deposition. The foregoing has described the principles and preferred embodiment of the present invention. However, the invention should not be construed as being limited to the particular embodiments described. The embodiments described above should be regarded as illustrative and not restrictive. Variations can be made to those embodiments by workers skilled in the art without departing from the scope of the present invention as defined by the following claims. For example, it is contemplated that the coil may be made as a multi-turn coil, if desired, and that the dimensions given in the detailed description may be varied, if desired.

What is claimed is:

1. A coil for use in an ion metal plasma physical vapor deposition chamber, said coil being made of a metallic strip formed into a one-turn loop, said metallic strip comprising a rigid core bonded to an outer layer of copper.

2. A coil as defined in claim 1 in which said rigid core is made of Titanium.

3. A coil as defined in claim 1 in which said rigid core is made of Tantalum.

4. A coil as defined in claim 1 in which said rigid core is made of Tungsten.

5. A coil as defined in claim 1 in which said rigid core is made of Aluminum.

6. A coil as defined in claim 1 in which said rigid core is made of Aluminum alloy.

7. A coil as defined in claim 1 in which said rigid core is made of stainless steel.

8. A coil as defined in claim 1 in which said rigid core is made of an iron alloy.

9. A coil as defined in claim 1 in which said rigid core is made of a nickel based alloy.

10. A coil as defined in claim 1 in which said rigid core is made of Titanium and Tantalum.

11. A coil as defined in claim 1 in which said rigid core is made of Titanium and Tungsten.

12. A coil as defined in claim 1 in which said rigid core is made of Titanium and copper.

13. A coil as defined in claim 1 in which said rigid core is bonded to said outer layer of copper by a diffusion bonding process in which the rigid core and the outer layer are pressed together at high pressure and ultrasonic energy is applied thereto.

14. A coil as defined in claim 1 in which said coil is made of a metallic strip approximately 30"×1.5"×0.25", formed into a loop.

15. A machine for applying copper deposition to a semiconductor substrate, said machine comprising:
   a) a deposition chamber: and
   b) a coil disposed in said chamber, said coil said coil being made of a metallic strip formed into a one-turn loop, said metallic strip comprising a rigid core bonded to an outer layer of copper.

16. A coil for use in an ion metal plasma physical vapor deposition chamber, said coil being made of a metallic strip approximately 30"×1.5"×0.25", said metallic strip being formed into a one-turn loop, said metallic strip comprising a rigid core surrounded by an outer layer of copper, said rigid core being made, at least in part, of a material selected from one of the following refractory metals: Titanium, Tantalum or Tungsten, said rigid core being bonded to said outer layer of copper by a diffusion bonding process in which the rigid core and the outer layer are pressed together at high pressure and ultrasonic energy is applied thereto.

* * * * *